(12) United States Patent
Song et al.

(10) Patent No.: US 8,427,459 B2
(45) Date of Patent: Apr. 23, 2013

(54) DRIVING CIRCUIT AND DISPLAY DEVICE WITH FIRST AND SECOND PAIRS OF AMPLIFIERS

(75) Inventors: Jun Ho Song, Seoul (KR); Chul Ho Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 566 days.

(21) Appl. No.: 12/656,729

(22) Filed: Feb. 16, 2010

(65) Prior Publication Data

US 2010/0207921 A1 Aug. 19, 2010

(30) Foreign Application Priority Data

Feb. 18, 2009 (KR) ........................ 10-2009-0013493

(51) Int. Cl.
 *G06F 3/038* (2006.01)
 *G09G 5/00* (2006.01)
(52) U.S. Cl.
 USPC ........................................................ 345/204
(58) Field of Classification Search .................. None
 See application file for complete search history.

(56) References Cited

U.S. PATENT DOCUMENTS

| 5,623,279 | A | * | 4/1997 | Itakura et al. ................... 345/98 |
| 6,188,395 | B1 | * | 2/2001 | Yatabe ........................ 345/211 |
| 7,126,596 | B1 | * | 10/2006 | Hogan ........................ 345/211 |
| 7,190,357 | B2 | * | 3/2007 | Ohta et al. ................... 345/204 |
| 2005/0259058 | A1 | * | 11/2005 | Yamaguchi et al. ........... 345/87 |
| 2006/0098032 | A1 | * | 5/2006 | Nakahira et al. ............. 345/690 |
| 2007/0146075 | A1 | * | 6/2007 | Sekimoto et al. ............ 330/289 |
| 2007/0273405 | A1 | * | 11/2007 | Yeh et al. ........................ 326/82 |
| 2008/0238851 | A1 | * | 10/2008 | Chen ............................... 345/98 |
| 2009/0201283 | A1 | * | 8/2009 | Inokuchi et al. .............. 345/212 |

FOREIGN PATENT DOCUMENTS

| JP | 2004-118177 | 4/2004 |
| KR | 10-2004-0049348 | 6/2004 |
| KR | 10-2006-0065048 | 6/2006 |
| KR | 10-2006-0065224 | 6/2006 |

\* cited by examiner

*Primary Examiner* — Amare Mengistu
*Assistant Examiner* — Antonio Xavier
(74) *Attorney, Agent, or Firm* — Harness, Dickey & Pierce, P.L.C.

(57) ABSTRACT

A driving circuit includes a pair of first amplifiers and a pair of second amplifiers for amplifying output signal of the first amplifiers. The input signal of any one of the pair of second amplifiers is input by passing through any one of the pair of first amplifiers. The input signal of the other one of the pair of second amplifiers is input by passing through the other one of the pair of first amplifiers.

16 Claims, 9 Drawing Sheets

DRIVING CIRCUIT AND DISPLAY DEVICE WITH FIRST AND SECOND PAIRS OF AMPLIFIERS

CROSS-REFERENCE TO RELATED APPLICATIONS

This application claims the benefit of Korean Patent Application No. 10-2009-0013493, filed on Feb. 18, 2009, in the Korean Intellectual Property Office (KIPO), the entire contents of which is incorporated herein by reference.

BACKGROUND

Example embodiments of the inventive concept relate to a driving circuit, and more particularly, to a driving circuit having an improved offset voltage characteristic, and a display device including the driving circuit.

In liquid crystal display devices, to reduce the chip size of a source driver and improve an operation temperature characteristic, a method of using amplifiers having an operation range that is smaller than the operation range of an output signal of the source driver and overlaps each other, thus covering the operation range of the output signal of the source driver has been widely used.

For example, different amplifiers, according to the range of an input signal, may be used for the amplification operation of the input signal. The amplifiers used for the amplification of the input signal may have different offset voltages based on process variation. The difference in the offset voltage of the different amplifiers used for the amplification of the input signal may deteriorate the characteristic of the output signal.

In general, the amplifier used for the amplification of the input signal is implemented by a differential amplifier. Mismatch due to process variation of a different transistor pair of the different amplifier works as a critical factor affecting the offset characteristic of the amplifier.

To reduce the mismatch of the differential transistor pair, the size of the differential transistor pair needs to be increased. However, to increase the size of the differential transistor pair is contrary to a trend of miniaturization of a chip and low power consumption.

SUMMARY

Example embodiments of the inventive concept provide a driving circuit which may improve an offset characteristic without increasing the size of a transistor forming an amplifier, and a display device including the driving circuit.

According to an example embodiment of the inventive concept, there is provided a driving circuit including a first selection circuit, a pair of first amplifiers, a second selection circuit, a pair of second amplifiers, and a third selection circuit.

The first selection circuit may control paths of a first input signal and a second input signal. Each of the pair of first amplifiers may amplify and output a corresponding output signal of the first selection circuit. The second selection circuit may control paths of output signals of the pair of first amplifiers.

Each of the pair of second amplifiers may include an operation voltage range included in the operation voltage range of the pair of first amplifiers and amplify and output a corresponding output signal of the second selection circuit. The third selection circuit may control paths of output signals of the pair of second amplifiers to be output to a first output terminal and a second output terminal.

The output signal output to the first output terminal may be a signal amplified by any one of the pair of first amplifiers, and the output signal output to the second output terminal may be a signal amplified by the other one of the pair of first amplifiers.

The driving circuit may further include a fourth selection circuit that receives the output signals of the pair of second amplifiers, outputs the output signal of any one of the pair of second amplifiers to any one of the pair of first amplifiers, and outputs the output signal of the other one of the pair of second amplifiers to the other one of the pair of first amplifiers.

The operation voltage range of each of the pair of first amplifiers may correspond to the operation voltage range of the driving circuit, and the operation voltage range of each of the pair of second amplifiers may be smaller than the operation voltage range of the driving circuit.

The operation voltage range of any one of the pair of second amplifiers may include an upper area of the operation voltage range of the driving circuit, the operation voltage range of the other one of the pair of second amplifiers may include a lower area of the operation voltage range of the driving circuit, and the operation voltage range of the any one of the pair of second amplifiers and the operation voltage range of the other one of the pair of second amplifiers may overlap each other in an intermediate area of the operation voltage range of the driving circuit.

The above-described driving circuit may be used for a source driver of a display device.

According to an example embodiment of the inventive concept, there is provided a driving circuit including a first selection circuit, a first rail to rail amplifier, a second selection circuit, a second rail to rail amplifier, and a third selection circuit. The first rail to rail amplifier may include a first input amplifier and a first output amplifier. The second rail to rail amplifier may include a second input amplifier and a second output amplifier. The first selection circuit may be configured to control paths of a first input signal and a second input signal input to the first input amplifier and the second input amplifier.

The second selection circuit may be configured to control paths of output signals of the first input amplifier and the second input amplifier. The third selection circuit may be configured to control paths of output signals of the first output amplifier and the second output amplifier to be output to a first output terminal and a second output terminal. An output signal output to the first output terminal may be a signal amplified by the first input amplifier, and an output signal output to the second output terminal may be a signal amplified by the second input amplifier.

According to an example embodiment of the inventive concept, there is provided a driving circuit including a pair of first amplifiers and a pair of second amplifiers. The pair of first amplifiers may be configured to selectively amplify a first input signal and a second input signal. The pair of second amplifiers, each of the pair of second amplifiers may include an operation voltage range included in an operation voltage range of the pair of first amplifiers, the pair of second amplifiers may be configured to selectively amplify an output of the pair of first amplifiers, and an offset voltage of the driving circuit may be based on an offset voltage of a first of the pair of second amplifiers and on an offset voltage of a second of the pair of second amplifiers.

BRIEF DESCRIPTION OF THE DRAWINGS

Example embodiments of the inventive concept will be more clearly understood from the following detailed description taken in conjunction with the accompanying drawings in which.

Figure 1A:
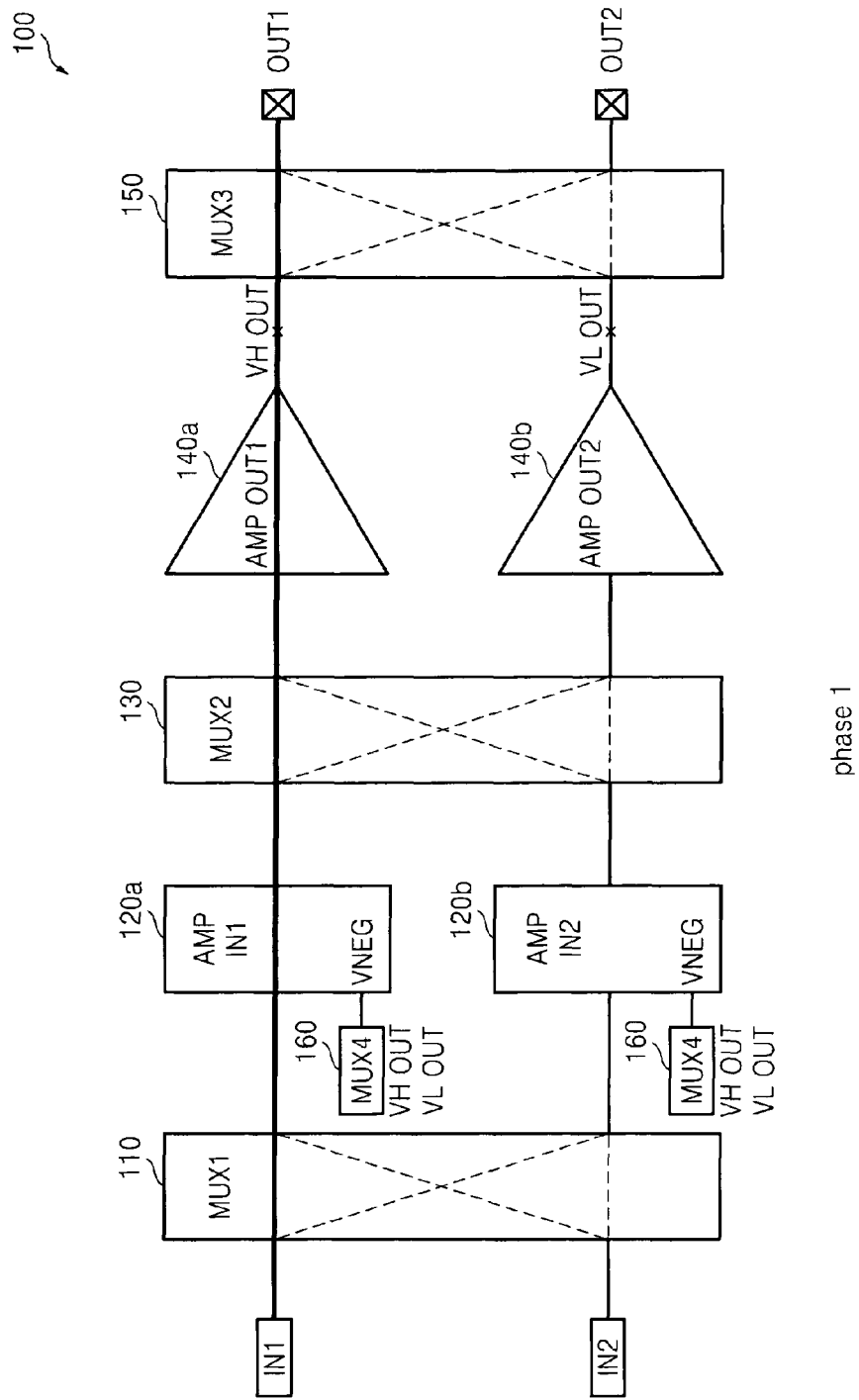
FIGS. 1A and 1B are block diagrams of a driving circuit according to an example embodiment of the present inventive concept.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the present inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
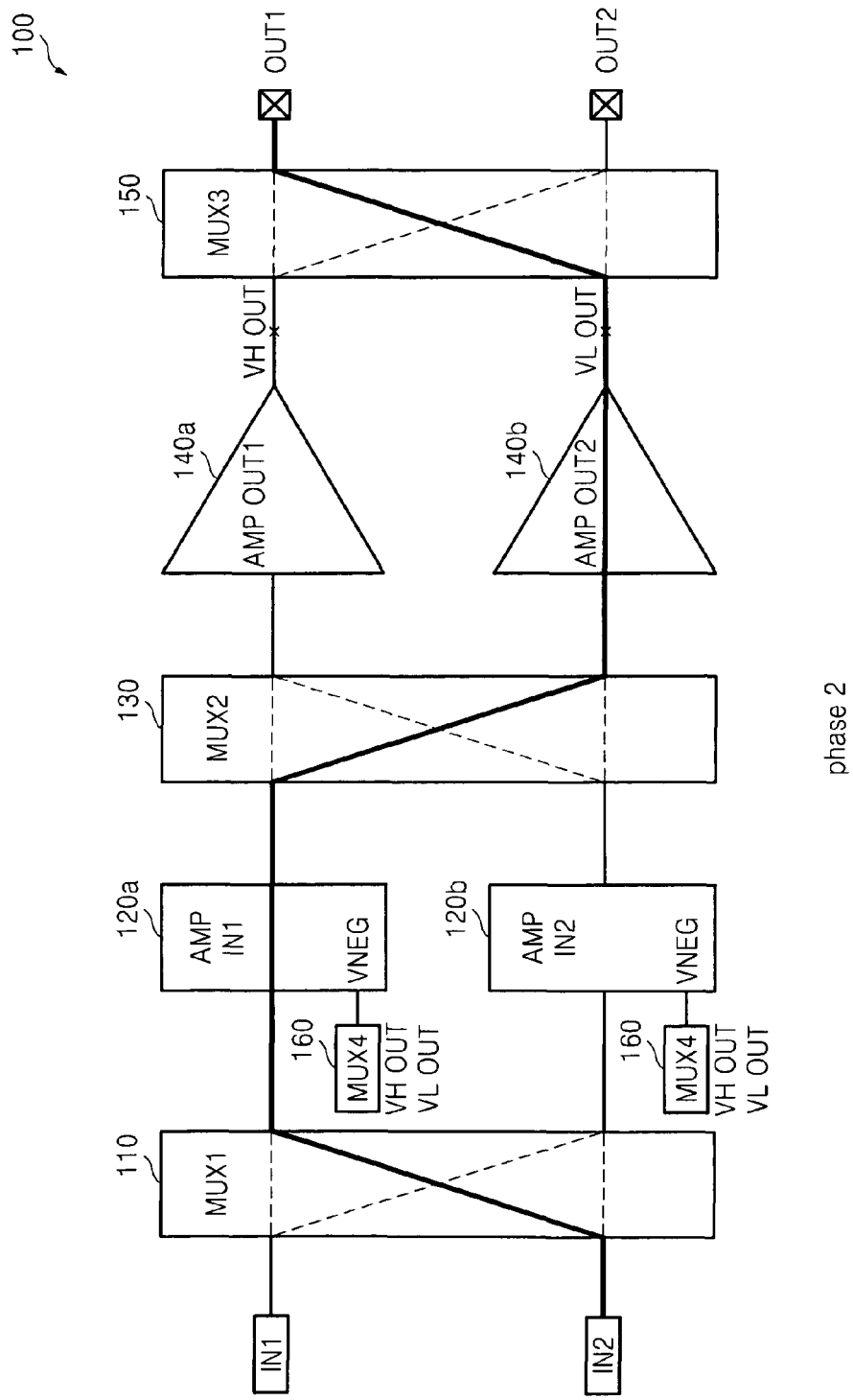

FIGS. 1A and 1B are block diagrams of a driving circuit 100 according to an example embodiment of the present inventive concept. Referring to FIGS. 1A and 1B, the driving circuit 100 includes a pair of first amplifiers 120a and 120b, a pair of second amplifiers 140a and 140b, a first selection circuit 110, a second selection circuit 130, a third selection circuit 150, and a fourth selection circuit 160.

The first selection circuit 110 may control the paths of a first input signal IN1 and a second input signal IN2. The driving circuit 100 may amplify an input signal through different amplification paths according to a range of the input signal. For example, in FIGS. 1A and 1B, the first and second input signals IN1 and IN2 may be image signals of a display device, whose polarities are reversed in units of frames to prevent deterioration of an LCD panel (not shown).

As illustrated in FIGS. 1A and 1B, the first selection circuit 110 may be implemented by a multiplexer MUX1 that selectively outputs the first input signal IN1 or the second input signal IN2. If the first input signal IN1 or the second input signal IN2 are image signals configured to prevent the deterioration of the LCD panel, the first selection circuit 110 may selectively output the first input signal IN1 or the second input signal IN2 in response to a polarity control signal (not shown) to control the polarity of an image signal.

As illustrated in FIGS. 1A and 1B, the first selection circuit 110 may output the first input signal IN1 to a corresponding amplifier (e.g., the first amplifier 120a) of the pair of first amplifiers 120a and 120b, in a first driving phase (phase 1), and the second input signal IN2 to a corresponding amplifier (e.g., the first amplifier 120a) of the pair of first amplifiers 120a and 120b, in a second driving phase (phase 2).

The first input signal IN1 may be an image signal of a positive polarity applied to the LCD panel, whereas the second input signal IN2 may be an image signal of a negative polarity applied to the LCD panel. The first input signal IN1 may denote an image signal of a positive polarity and the second input signal IN2 may denote an image signal of a negative polarity.

Each of the pair of first amplifiers 120a and 120b may amplify and output a corresponding output signal of the first selection circuit 110. Referring to FIGS. 1A and 1B, for example, the amplifier 120a, of the pair of first amplifiers 120a and 120b amplifies and outputs the first input signal IN1 in the first driving phase (phase 1) and the second input signal IN2 in the second driving phase (phase 2).

The second selection circuit 130 may control the paths of the output signals of the pair of first amplifiers 120a and 120b. The second selection circuit 130 may be implemented by a multiplexer MUX2 that operates in response to the polarity control signal, like the first selection circuit 110.

As illustrated in FIGS. 1A and 1B, the second selection circuit 130 may output an output signal of a corresponding amplifier (e.g., amplifier 120a) of the pair of first amplifiers 120a and 120b to a corresponding amplifier (e.g., amplifier 140a) of the pair of second amplifiers 140a and 140b, in the first phase (phase 1), and an output signal of a corresponding amplifier (e.g., the first amplifier 120a) of the pair of first amplifiers 120a and 120b to a corresponding amplifier (e.g., amplifier 140b) of the pair of second amplifiers 140a and 140b, in the second phase (phase 2).

Each of the pair of second amplifiers 140a and 140b may amplify and output a corresponding output signal of the second selection circuit 130. Referring to FIGS. 1A and 1B, in the first driving phase (phase 1), any amplifier, for example, the amplifier 140a, of the pair of second amplifiers 140a and 140b may amplify and output the output signal of any amplifier, for example, the amplifier 120a, of the pair of first amplifiers 120a and 120b. In the second driving phase (phase 2), the other amplifier, for example, the amplifier 140b, of the pair of second amplifiers 140a and 140b may amplify the output signal of any amplifier, for example, the amplifier 120a, of the pair of first amplifiers 120a and 120b.

Each of the pair of second amplifiers 140a and 140b may have an operation range included in the operation range of the pair of first amplifiers 120a and 120b. For example, the operation range of each of the pair of first amplifiers 120a and 120b corresponds to the operation range of the driving circuit 100. The operation range of each of the pair of second amplifiers 140a and 140b may be relatively smaller than that of the driving circuit 100.

The operation range of each of the amplifiers 120a, 120b, 140a, and 140b included in the driving circuit 100 may be determined by a power voltage supplied to each of the amplifiers 120a, 120b, 140a, and 140b.

The third selection circuit 150 may control the paths of output signals VH OUT and VL OUT of the pair of second amplifiers 140a and 140b to output the output signals VH OUT and VL OUT, respectively, to a first output terminal OUT1 and a second output terminal OUT2. If the first and second input signals IN1 and IN2 are image signal with opposite polarities, the first and second output terminals OUT1 and OUT2 may be connected to a corresponding source line of a plurality of source lines of the LCD panel. The third selection circuit 150 may be implemented by a multiplexer MUX3 operating in response to the polarity control signal, like the first and second selection circuits 110 and 130.

Referring to FIGS. 1A and 1B, the third selection circuit 150 may output the output signal VH OUT of any amplifier (e.g., amplifier 140a) of the pair of second amplifiers 140a and 140b to the first output terminal OUT1, in the first driving phase (phase 1), and the output signal VL OUT of the other amplifier (e.g., amplifier 140b) of the pair of second amplifiers 140a and 140b to the first output terminal OUT1, in the second driving phase (phase 2).

As described above, the output signals VH OUT and VL OUT of the pair of second amplifiers 140a and 140b, output to the first output terminal OUT 1 in the first and second driving phases (phase 1 and phase 2) are signals amplified by any amplifier, for example, amplifier 120a, of the pair of first amplifiers 120a and 120b. Although not illustrated in FIGS. 1A and 1B, both of the output signals VH OUT and VL OUT of the pair of second amplifiers 140a and 140b output to the second output terminal OUT 2 are signals amplified by the other amplifier, for example, the amplifier 120b, of the pair of first amplifiers 120a and 120b.

Figure 2:
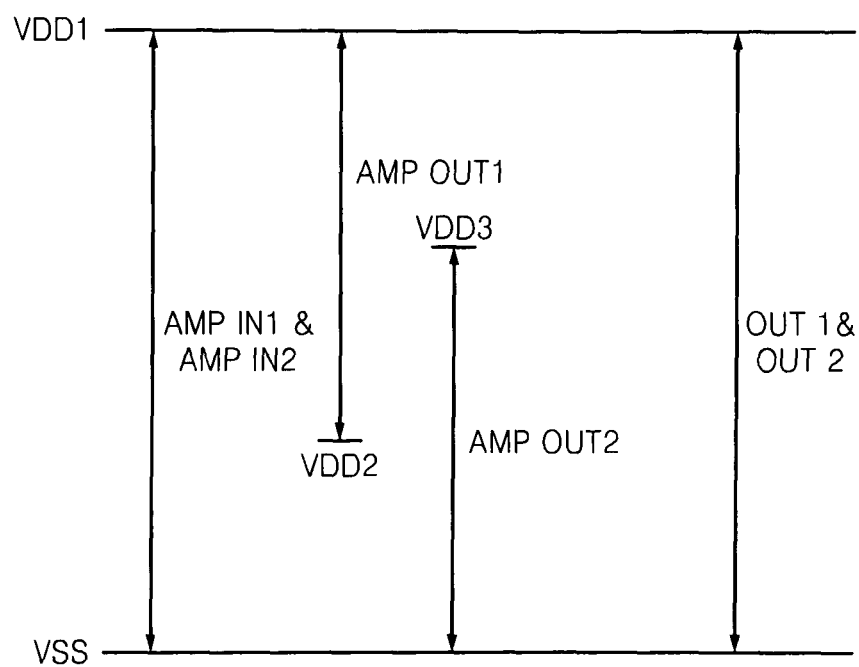
FIG. 2 is a graph showing the operation ranges of the amplifiers included in the driving circuit of FIG. 1.

FIG. 2 is a graph showing the operation ranges of the amplifiers 120a, 120b, 140a, and 140b included in the driving circuit 100 of FIG. 1. Referring to FIGS. 1A-2, the operation ranges AMP IN1 and AMP IN2 of the pair of first amplifiers 120a and 120b may correspond to the operation range OUT of the driving circuit 100 formed between a first power voltage VDD1 and a group voltage VSS.

The operation range AMP OUT1 of any amplifier, (e.g., the amplifier 140a) of the pair of second amplifiers 140a and 140b includes an upper area of the operation range OUT of the driving circuit 100 from the first power voltage VDD1 to a second power voltage VDD2. The operation range AMP OUT2 of the other amplifier, (e.g., the amplifier 140b) of the pair of second amplifiers 140a and 140b includes a lower area of the operation range OUT of the driving circuit 100 from a third power voltage VDD3 to the ground voltage VSS.

The operation range AMP OUT1 of any amplifier (e.g., the amplifier 140a) of the pair of second amplifiers 140a and 140b and the operation range AMP OUT2 of the other amplifier, (e.g., the amplifier 140b) of the pair of second amplifiers 140a and 140b overlap each other in an intermediate area of the operation range OUT of the driving circuit 100 from the third power voltage VDD3 to the second power voltage VDD2. Thus, the pair of second amplifiers 140a and 140b may cover the whole area of the operation range OUT of the driving circuit 100.

The operation ranges of the amplifiers 120a, 120b, 140a, and 140b illustrated in FIG. 2 indicate the operation range of each amplifier if the amplifiers 120a, 120b, 140a, and 140b are assumed to be ideal amplifiers. For example, in FIG. 2, the operation ranges of the respective amplifiers are illustrated based on the power voltage applied to each amplifier and the reduction in the operation range that may be generated during an actual operation is not taken into consideration.

In the path of the signal output to the first output terminal OUT 1, the signal passes through any amplifier (e.g., the amplifier 120*a*) of the pair of first amplifiers 120*a* and 120*b* in the first driving phase (phase 1). Thus, the difference in the offset voltage of the driving circuit 100 according to the driving phase has no relation to the pair of first amplifiers 120*a* and 120*b* and may be generated only by the difference in the offset voltage of the pair of second amplifiers 140*a* and 140*b* in the first and second driving phases (phase 1 and phase 2).

Also, the offset voltage of the driving circuit 100 with respect to the signal output to the second output terminal OUT 2 via the other amplifier (e.g., the amplifier 120*b*) of the pair of first amplifiers 120*a* and 102*b* may be generated by the difference in the offset voltage of the pair of second amplifiers 140*a* and 140*b* in the first and second driving phases (phase 1 and phase 2).

Equation 1 expresses the offset voltage of the driving circuit 100 in the first driving phase (phase 1).

$$\text{Vos\_phase 1} = \text{Vos(ampin1)} + \text{Vos(ampout1)} \quad \text{[Equation 1]}$$

In Equation 1, "Vos_phase 1" denotes the offset voltage of the driving circuit 100 in the first driving phase (phase 1). "Vos(ampin1)" denotes the offset voltage of any amplifier (e.g., the amplifier 120*a*) of the pair of first amplifiers 120*a* and 120*b*. "Vos(ampout1)" denotes the offset voltage of any amplifier (e.g., the amplifier 140*a*) of the pair of second amplifiers 140*a* and 140*b*.

Referring to Equation 1, the offset voltage of the driving circuit 100 in the first driving phase (phase 1) may be determined, by the sum of the offset voltage Vos(ampin1) of the amplifier 120*a* and the offset voltage Vos(ampout1) of the amplifier 140*a*.

Equation 2 expresses the offset voltage of the driving circuit 100 in the second driving phase (phase 2).

$$\text{Vos\_phase 2} = \text{Vos(ampin1)} + \text{Vos(ampout2)} \quad \text{[Equation 2]}$$

In Equation 2, "Vos_phase 2" denotes the offset voltage of the driving circuit 100 in the second driving phase (phase 2). "Vos(ampin1)" denotes the offset voltage of any amplifier (e.g., the amplifier 120*a*) of the pair of first amplifiers 120*a* and 120*b*. "Vos(ampout2)" denotes the offset voltage of any amplifier (e.g., the amplifier 140*b*) of the pair of second amplifiers 140*a* and 140*b*.

Referring to Equation 2, the offset voltage of the driving circuit 100 in the second driving phase (phase 2) may be determined by the sum of the offset voltage Vos(ampin1) of the amplifier 120*a* and the offset voltage Vos(ampout2) of the amplifier 140*b*.

$$\begin{aligned}\text{Vos\_phase} &= \text{Vos\_phase1} - \text{Vos\_phase2} \quad \text{[Equation 3]}\\ &= [Vos(ampin1) + Vos(ampout1)] - \\ &\quad [Vos(ampin1) + Vos(ampout2)] \\ &= Vos(ampout1) - Vos(ampout2)\end{aligned}$$

In Equation 3, "Vos_phase" denotes the difference in the offset voltage of the driving circuit 100 according to the driving phase. Referring to Equation 3, the difference in the offset voltage of the driving circuit 100 according to the driving phase may be irrelevant to the offset voltage of the pair of first amplifiers 120*a* and 120*b* and determined by the difference in the offset voltage of the pair of second amplifiers 140*a* and 140*b*.

For example, because the variation of the offset voltage according to the driving phase of the driving circuit 100 is not affected by the pair of first amplifiers 120*a* and 120*b* and determined by the difference in the offset voltage of the pair of second amplifiers 140*a* and 140*b*, the offset characteristic of the driving circuit 100 may be improved.

The fourth selection circuit 160 may receive the output signals VH OUT and VL OUT of the pair of second amplifiers 140*a* and 140*b*, and output the output signal of any amplifier of the pair of second amplifiers 140*a* and 140*b* to any amplifier of the pair of first amplifiers 120*a* and 120*b* and the output signal of the other amplifier of the pair of second amplifiers 140*a* and 140*b* to the other amplifier of the pair of first amplifiers 120*a* and 120*b*.

For example, the fourth selection circuit 160 may output the output signal VH OUT of any amplifier (e.g., the amplifier 140*a*) of the pair of second amplifiers 140*a* and 140*b* to any amplifier (e.g., the amplifier 120*a*) of the pair of first amplifiers 120*a* and 120*b*, in the first driving phase (phase 1), and the output signal VL OUT of the other amplifier (e.g., the amplifier 140*b*) of the pair of second amplifiers 140*a* and 140*b* to any amplifier (e.g., the amplifier 120*a*) of the pair of first amplifiers 120*a* and 120*b*, in the second driving phase (phase 2).

Also, the fourth selection circuit 160 may output the output signal VH OUT of the other amplifier (e.g., the amplifier 140*b*) of the pair of second amplifiers 140*a* and 140*b* to the other amplifier (e.g., the amplifier 120*b*) of the pair of first amplifiers 120*a* and 120*b*, in the first driving phase (phase 1), and the output signal VL OUT of the other amplifier (e.g., the amplifier 140*b*) of the pair of second amplifiers 140*a* and 140*b* to the other amplifier (e.g., the amplifier 120*b*) of the pair of first amplifiers 120*a* and 120*b*, in the second driving phase (phase 2).

For example, the fourth selection circuit 160 outputs the output signals VH OUT and VL OUT of the pair of second amplifiers 140*a* and 140*b* of the driving circuit 100 to an input terminal VNEG of each of the pair of first amplifiers 120*a* and 120*b*, thereby forming a negative feedback path. The driving circuit 100 using the feedback operation of the fourth selection circuit 160 may be used as an output buffer included in a source driver of the display device. However, the example embodiment of the inventive concept is not limited thereto.

In the above description, the improvement of the offset characteristic of the signal output to the first output terminal OUT1 is described with reference to FIGS. 1A-2. In addition, the offset characteristic of the signal output to the second output terminal OUT2 may be improved, which will be clarified by considering the path of the signal output to the second output terminal OUT2.

Although not illustrated in FIGS. 1A and 1B, the signal output to the second Output terminal OUT2 in the first driving phase (phase 1) may be an output signal of the second input signal IN2 sequentially passing through the first selection circuit 110, the second input amplifier 120*b*, the second selection circuit 130, the second output amplifier 140*b*, and the third selection circuit 150.

Although not illustrated in FIGS. 1A and 1B, the signal output to the second output terminal OUT2 in the second driving phase (phase 2) may be an output signal of the first input signal IN1 sequentially passing through the first selection circuit 110, the second input amplifier 120*b*, the second selection circuit 130, the first output amplifier 140*a*, and the third selection circuit 150.

As described above, because the signal output to the second output terminal OUT2 commonly passes through the second input amplifier 120b, the offset characteristic of the signal output to the second output terminal OUT2 may be irrelevant to the pair of first amplifiers 120a and 120b and determined by the pair of second amplifiers 140a and 140b so that the offset characteristic of the driving circuit 100 may be improved.

Figure 3A:
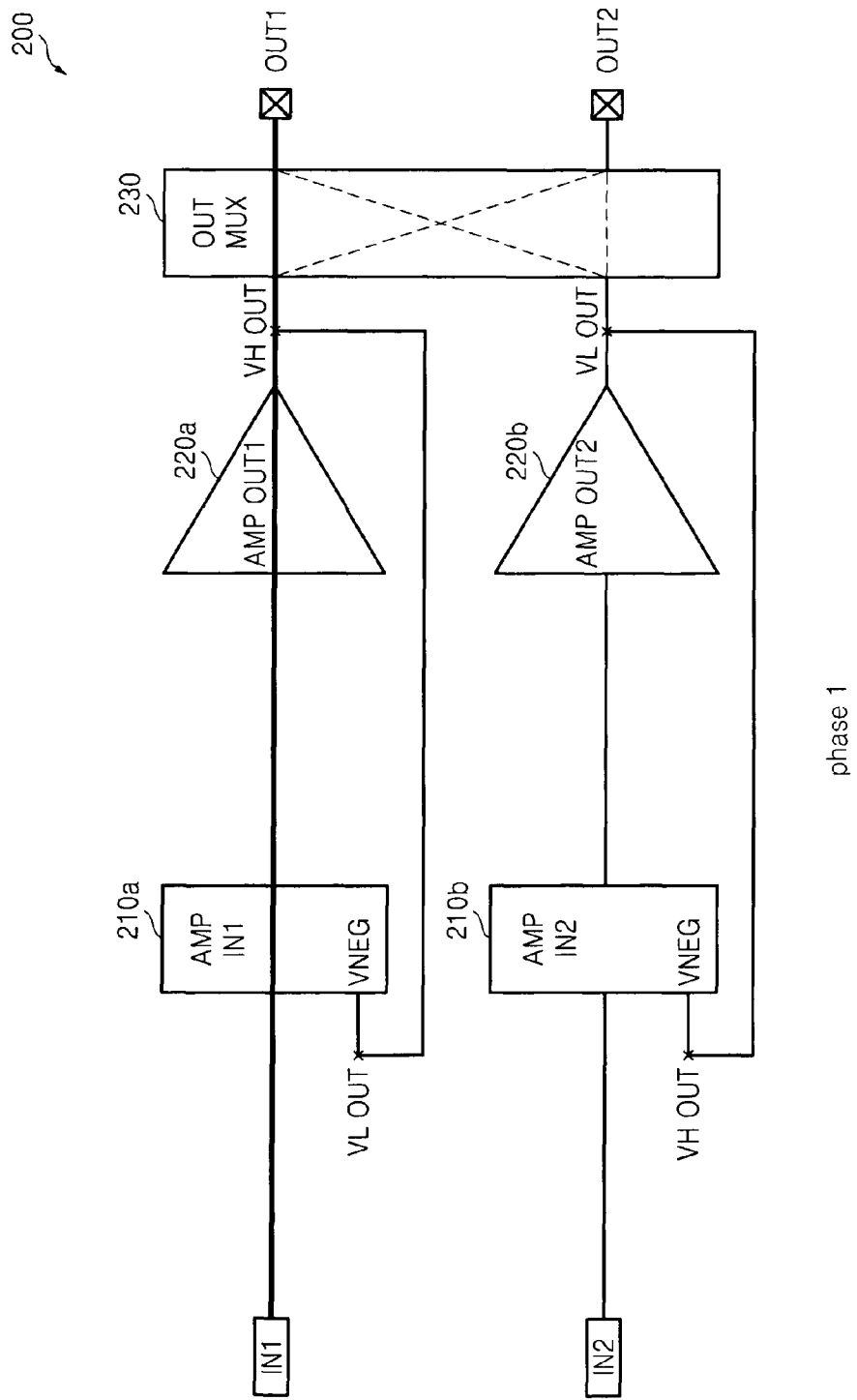
FIGS. 3A and 3B are block diagrams of a driving circuit according to a comparative example of the present inventive concept.
Figure 3B:
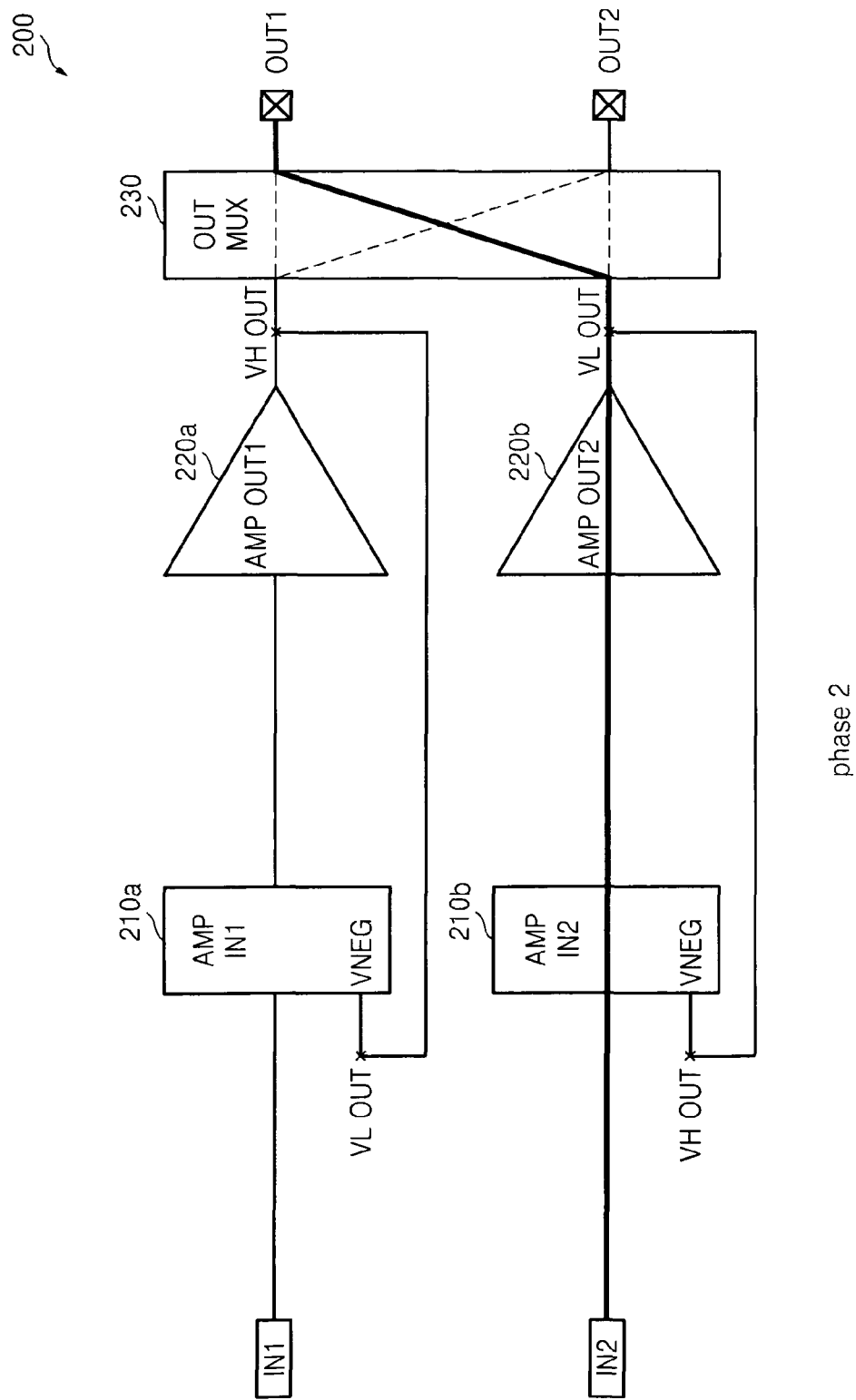

FIGS. 3A and 3B are block diagrams of a driving circuit 200 according to a comparative example of the example embodiments of the inventive concept. Referring to FIGS. 3A and 3B, in the driving circuit 200 according to the present comparative example, a feedback routes of the output signals VH OUT and VL OUT of a pair of second amplifiers 220a and 220b back to a pair of first amplifiers 210a and 210b may be formed.

Referring to FIG. 3A, in the first driving phase (phase 1), the signal output to the first output terminal OUT1 may pass through any amplifier (e.g., the amplifier 210a) of the pair of first amplifiers 210a and 210b, any amplifier (e.g., the amplifier 220a) of the pair of second amplifiers 220a and 220b, and the selection circuit 230.

Referring to FIG. 3B, in the second driving phase (phase 2), the signal output to the second output terminal OUT2 may pass through the other amplifier (e.g., the amplifier 210b) of the pair of first amplifiers 210a and 210b, the other amplifier (e.g., the amplifier 220b) of the pair of second amplifiers 220a and 220b, and the selection circuit 230.

Thus, the difference in the offset voltage of the driving circuit 200 according to the driving phase in the present comparative example may be determined by the difference between the offset voltage of the pair of first amplifiers 210a and 210b and the offset voltage of the pair of second amplifiers 220a and 220b.

$$\text{Vos\_phase'} = \text{Vos\_phase1'} - \text{Vos\_phase2'} \quad [\text{Equation 4}]$$
$$= [Vos'(ampin1) + Vos'(ampout1)] -$$
$$[Vos'(ampin2) + Vos'(ampout2)]$$

In Equation 4, "Vos_phase'" denotes the difference in the offset voltage of the driving circuit 200 according to the driving phase. "Vos_phase1'" denotes the difference in the offset voltage of the driving circuit 200 in the first driving phase (phase 1). "Vos_phase2'" denotes the difference in the offset voltage of the driving circuit 200 in the second driving phase (phase 2).

Also, "Vos'(ampin1)" denotes the offset voltage of any amplifier (e.g., the amplifier 210a) of the pair of first amplifiers 210a and 210b. "Vos'(ampout1)" denotes the offset voltage of any amplifier (e.g., the amplifier 220a) of the pair of second amplifiers 220a and 220b. "Vos'(ampin2)" denotes the offset voltage of the other amplifier (e.g., the amplifier 210b) of the pair of first amplifiers 210a and 210b. "Vos'(ampout2)" denotes the offset voltage of the other amplifier (e.g., the amplifier 220b) of the pair of second amplifiers 220a and 220b.

In comparison between Equation 3 and Equation 4, Equation 4 includes "[Vos'(ampin1)−Vos'(ampin2)]" indicating the difference in the offset voltage in the pair of first amplifiers 210a and 210b that is not included in Equation 3. This means that the variation of the offset voltage according to the driving phase of the driving circuit 100 according to the example embodiment of the inventive concept may be relatively smaller than that of the offset voltage according to the driving phase of the driving circuit 200 according to the comparative example.

Thus, a display device using the driving circuit 100 according to the example embodiment of the inventive concept as an output buffer of the source driver may present better image quality compared to a display device using the driving circuit 200 according to the comparative example as the output buffer of the source driver because the deviation of the output signal of the source driver according to the driving phase may be reduced.

Figure 4:
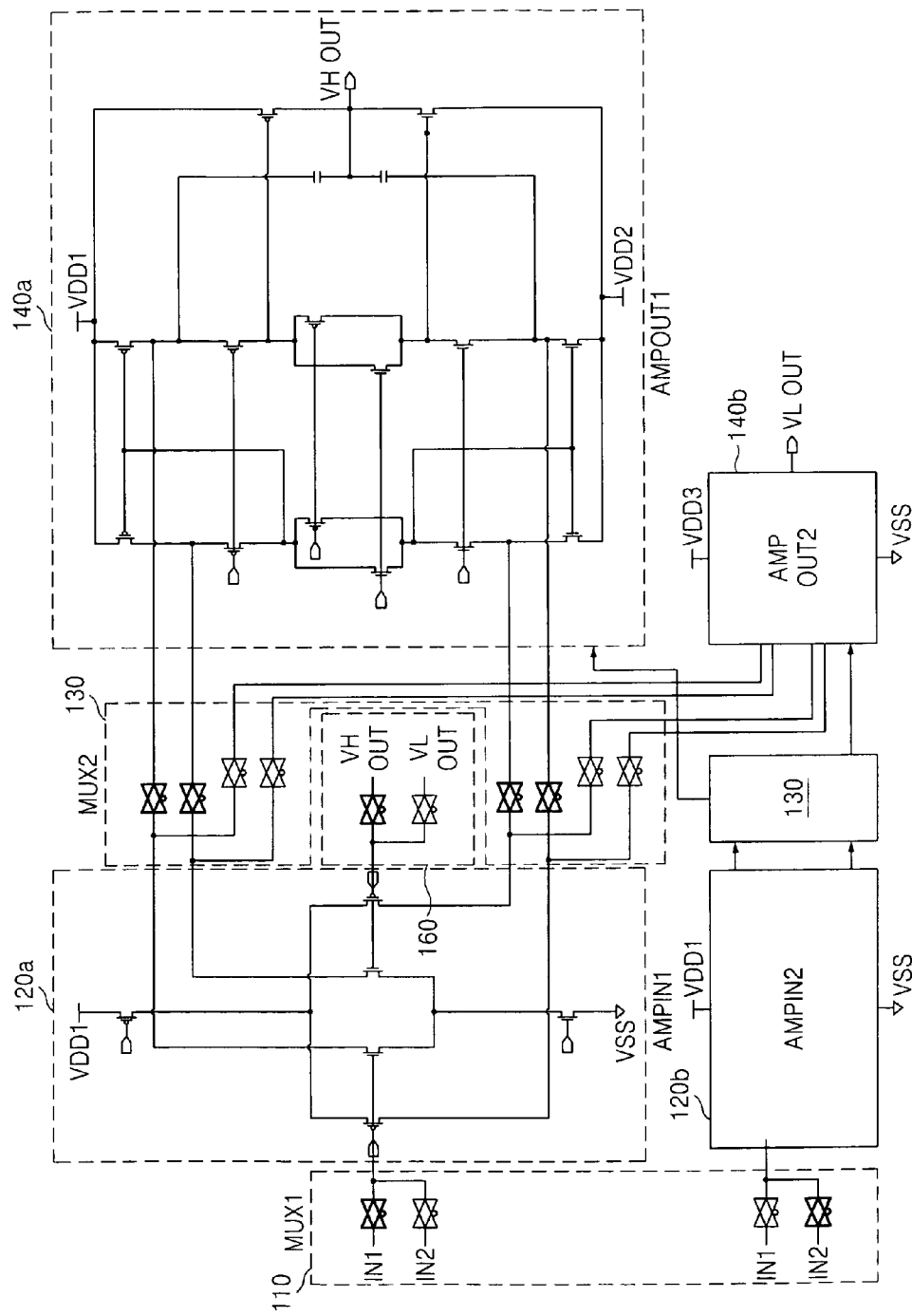
FIG. 4 is a circuit diagram of a driving circuit according to an example embodiment of the present inventive concept.

FIG. 4 is a circuit diagram of the driving circuit 100 according to an example embodiment of the present inventive concept. Referring to FIG. 4, the driving circuit 100 according to the example embodiment of the inventive concept includes a first rail to rail amplifiers 120a and 140a, a second rail to rail amplifiers 120b and 140b, the first selection circuit 110, the second selection circuit 130, and the fourth selection circuit 160.

In FIG. 4, the third selection circuit 150 that is illustrated in FIGS. 1A and 1B is not illustrated. Because the structure and operation of the rail to rail amplifiers 120a and 140a and 120b and 140b are widely known to those skilled in the art, detailed descriptions thereof will be omitted herein.

Because the structures of the second rail to rail amplifiers 120b and 140b are the same as those of the first rail to rail amplifiers 120a and 140a, the second rail to rail amplifiers 120b and 140b are illustrated as blocks. Also, the second selection circuit 130 corresponding to the second rail to rail amplifiers 120b and 140b has a structure symmetrical to the second selection circuit 130 corresponding to the first rail to rail amplifiers 120a and 140a, the second selection circuit 130 is illustrated as a block.

The first input amplifier 120a of the first rail to rail amplifiers 120a and 140a and the second input amplifier 120b of the second rail to rail amplifiers 120b and 140b, respectively, correspond to the pair of first amplifiers 120a and 120b of FIG. 1. The first output amplifier 140a of the first rail to rail amplifiers 120a and 140a and the second output amplifier 140b of the second rail to rail amplifiers 120b and 140b, respectively, correspond to the pair of second amplifiers 140a and 140b of FIG. 1.

Each of the first, second, and fourth selection circuits 110, 130, and 160 may be implemented by a multiplexer including a plurality of transmission gates.

As transmission gates, marked by thick lines, included in the selection circuits 110, 130, and 160 are turned on in the first driving phase (phase 1), and the other transmission gates in the selection circuits 110, 130, and 160 are turned on in the second driving phase (phase 2), the connection relationship among the constituent elements of the driving circuit 100 may be formed as described above with reference to FIG. 1.

In the first driving phase (phase 1) and the second driving phase (phase 2) of the driving circuit 100 of FIG. 4, although not illustrated in FIG. 4, the signal output to the first output terminal OUT1 of FIGS. 1A and 1B may be a signal amplified by the first input amplifier 120a, and the signal output to the second output terminal OUT2 of FIGS. 1A and 1B may be a signal amplified by the second input amplifier 120b.

Thus, the variation of the offset voltage according to the driving phase of the driving circuit 100 of FIG. 4 has no relation to the first and second input amplifiers 120a and 120b and may be determined by the difference in the offset voltage between the first and second output amplifiers 140a and 140b according to the driving phase, thereby having an improved offset characteristic compared to the general data driving circuit.

In FIG. 4, the power voltages supplied to the first and second input amplifiers 120a and 120b are the first power voltage VDD1 and the ground voltage VSS, respectively. Thus, the operation ranges of the first and second input amplifiers 120a and 120b may be formed between the first power voltage VDD1 and the ground voltage VSS as illustrated in FIG. 2.

The power voltage supplied to the first output amplifier 140a is the first power voltage VDD1 and the second power voltage VDD2. Thus, the operation range of the first output amplifier 140a may be a voltage between the first and second power voltages VDD1 and VDD2 as illustrated in FIG. 2.

Also, as illustrated in FIG. 2, the operation range of the first output amplifier 140a and the operation range of the second output amplifier 140b may overlap each other in the operation range between the third power voltage VDD3 and the second power voltage VDD2 of the operation range of the driving circuit 100.

Figure 5:
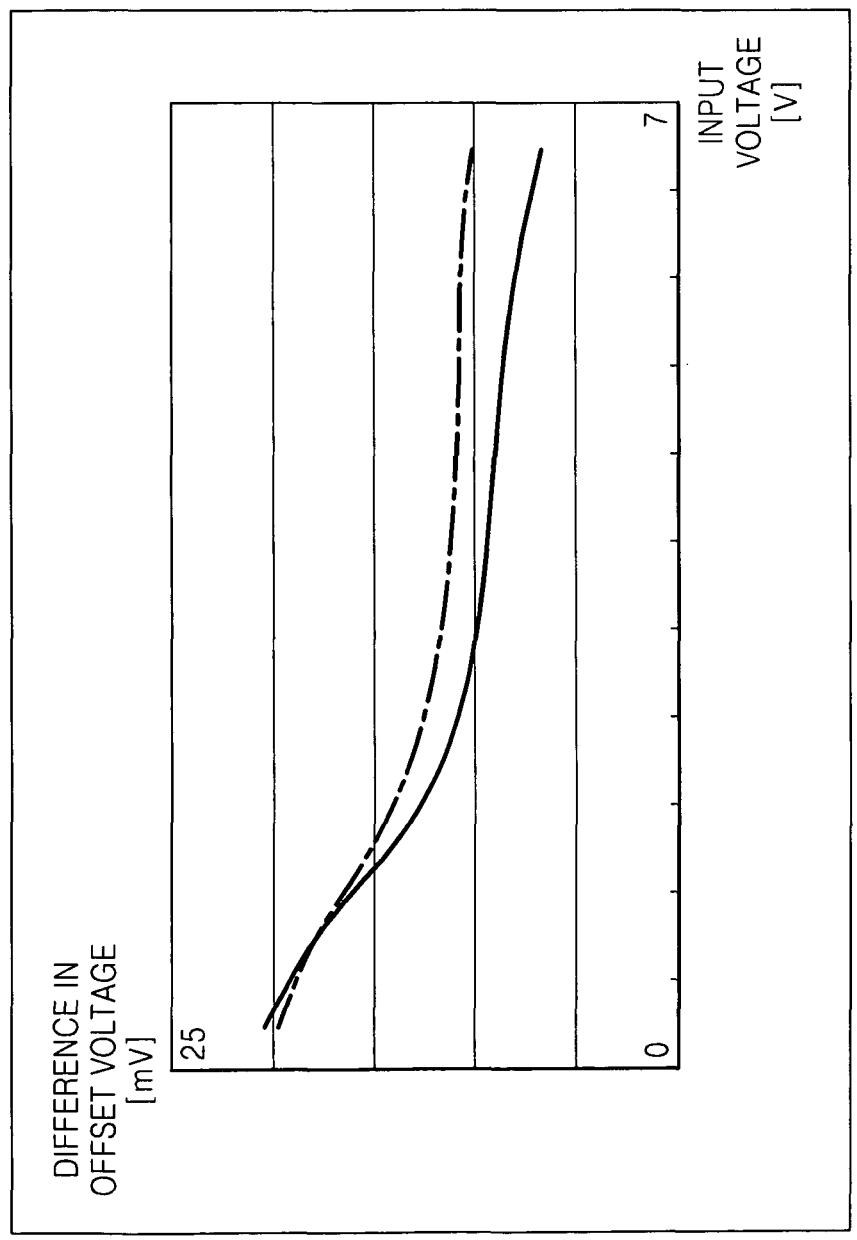
FIG. 5 is a graph showing the offset characteristics of a general driving circuit and a driving circuit according to an example embodiment of the present inventive concept.

FIG. 5 is a graph showing the offset characteristics of the general driving circuit and the driving circuit 100 according to an example embodiment of the present inventive concept. In the graph of FIG. 5, a solid line indicates the offset characteristic of the driving circuit 100 according to the example embodiment of the present inventive concept, and a single-dot dashed line indicates the offset characteristic of the general driving circuit.

Referring to FIG. 5, with respect to the input voltage from 0 V to 7 V, the offset characteristic of the driving circuit 100 according to the example embodiment of the inventive concept may generally be improved over that of the general driving circuit.

Figure 6:
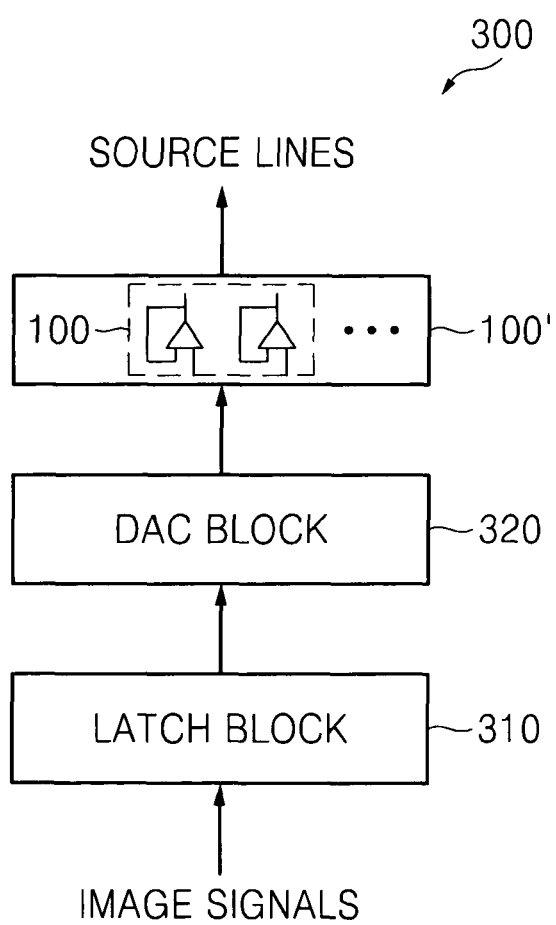
FIG. 6 is a block diagram of a source driver of a display device according to an example embodiment of the present inventive concept.

FIG. 6 is a block diagram of a source driver 300 of a display device according to an example embodiment of the present inventive concept. Referring to FIG. 6, the source driver 300 includes a latch block 310, a digital-to-analog conversion (DAC) block 320, and an output buffer block 100'.

The latch block 310 receives and stores an image signal and outputs the stored image signal to the DAC block 320 in response to a latching signal. The DAC block 320 may convert digital image signals output from the latch block 310 to an analog voltage and outputs the converted analog voltage.

The output buffer block 100' buffers the analog signal output from the DAC block 320 and outputs the buffered signal. The output buffer block 100' may improve the current driving capability of the source driver 300. The output buffer block 100' may include a plurality of output buffer pairs 100 corresponding to the source lines of a display panel (not shown).

Each of the output buffer pairs 100 may be implemented by the driving circuit 100 of FIGS. 1A, 1B, and 4. Since the driving circuit 100 illustrated in FIGS. 1A, 1B, and 4 is described above, a detailed description thereof will be omitted herein. However, when the first output terminal OUT1 illustrated in FIGS. 1A and 1B is connected to the odd-numbered source line of the display panel, the second output terminal OUT2 may be connected to the even-numbered source line of the display panel.

Because the output buffer block 100' of the source driver 300 according to the example embodiment of the inventive concept may buffer an output signal by using the driving circuit 100 of the example embodiment of the inventive concept, an output signal having a relatively small deviation according to the driving phase may be generated according to the general source driver.

Although FIG. 6 illustrates that the driving circuit 100 of the present example embodiment of the inventive concept may be used for the source driver 300 of the display device, the example embodiment of the inventive concept is not limited thereto. For example, the driving circuit 100 according to the example embodiment of the inventive concept may be used for electric apparatuses performing a plurality of amplification operations by using different paths according to the range of an input signal.

The driving circuit 100 and the source driver 300 according to the example embodiment of the inventive concept may be mounted by using a variety of packages. For example, the driving circuit 100 and the source driver 300 according to the example embodiment of the inventive concept may be mounted by using a package such as a package on package (PoP), ball grid arrays (BGAs), chip scale packages (CSPs), a plastic leaded chip carrier (PLCC), a plastic dual in-line (PDOP), a die in waffle pack, a die in wafer form, a chip on board (COB), a ceramic dual in-line package (CERDIP), a plastic metric quad flat pack (MQFP), a thin quad flatpack (TQFP), a small outline (SOIC), a shrink small outline package (SSOP), a thin small outline (TDOP), a thin quad flatpack (TQFP), a system in package (SIP), a multi chip package (MCP), a wafer-level fabricated package (WFP), and a wafer-level processed stack package (WSP).

Figure 7:
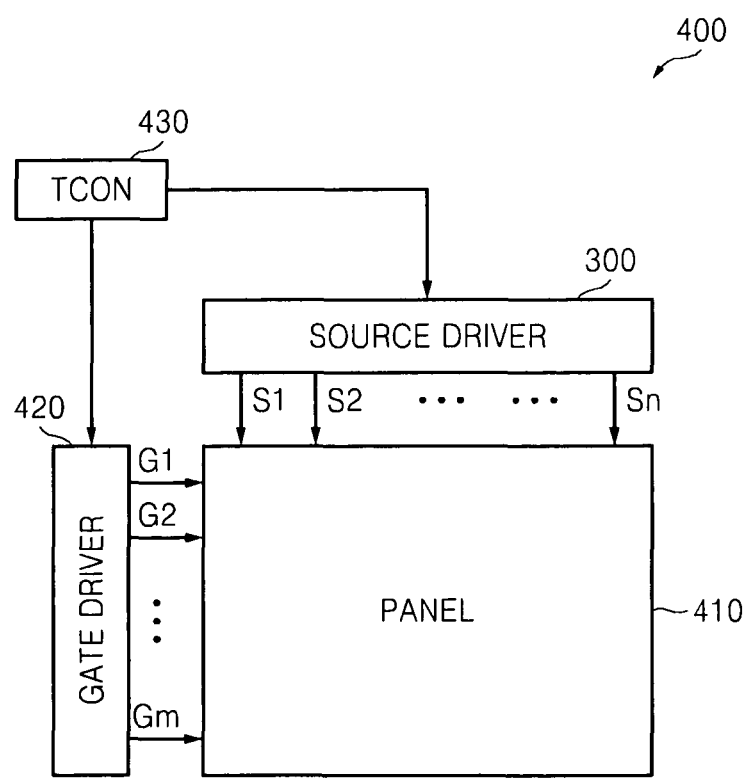
FIG. 7 is a block diagram of a display device according to an example embodiment of the present inventive concept.

FIG. 7 is a block diagram of a display device 400 according to an example embodiment of the inventive concept. Referring to FIG. 7, the display device 400 includes a panel 410, a gate driver 420, a source driver 300, and a timing controller 430.

The panel 410 may include a plurality of pixels (not shown) arranged in a matrix form. The gate driver 420 is connected to a plurality of gate lines G1, G2, ..., Gm of the pixels and controls the operation of the pixels. The source driver 300 outputs image signals to a plurality of source lines S1, S2, ..., S3 of the pixels.

Because the source driver 300 is already described above with reference to FIG. 6, a detailed description thereof will be omitted. The pixels included in the panel 410 may generate light in response to the image signals output from the source driver 300.

The display device 400 according to the example embodiment of the inventive concept which uses the source driver 300 generating an output signal having a relatively small deviation according to the driving phase compared to the general source driver may present superior image quality compared to the general display device.

As described above, the signals input to the same output amplifier of the driving circuit having different paths according to the range of an input signal according to the example embodiment of the present inventive concept may be a signal input via at least one same amplifier. Thus, the driving circuit according to the example embodiment of the present inventive concept has an effect to improve the offset characteristic of the output signal. Also, the display device according to the example embodiment of the present inventive concept may provide clear image quality.

While example embodiments of the inventive concept have been particularly shown and described with reference to exemplary embodiments thereof, it will be understood by one of ordinary skill in the art that various changes in form and details may be made therein without departing from the spirit and scope of the following claims.

What is claimed is:

1. A driving circuit comprising:
a first selection circuit configured to control paths of a first input signal and a second input signal;
a pair of first amplifiers, each amplifier of the pair of first amplifiers is configured to amplify and output a corresponding output signal of the first selection circuit;

a second selection circuit configured to control paths of output signals of the pair of first amplifiers;
a pair of second amplifiers, each amplifier of the pair of second amplifiers including an operation voltage range included in an operation voltage range of the pair of first amplifiers and configured to amplify and output a corresponding output signal of the second selection circuit; and
a third selection circuit configured to control paths of output signals of the pair of second amplifiers to be output to a first output terminal and a second output terminal,
wherein an output signal output to the first output terminal is a signal amplified by any one of the pair of first amplifiers, and an output signal output to the second output terminal is a signal amplified by the other one of the pair of first amplifiers, and
wherein an operation voltage range of each of the pair of first amplifiers corresponds to an operation voltage range of the driving circuit, and an operation voltage range of each of the pair of second amplifiers is smaller than the operation voltage range of the driving circuit.

2. The driving circuit of claim 1, further comprising:
a fourth selection circuit configured to receive the output signals of the pair of second amplifiers, the fourth selection circuit configured to output an output signal of any one of the pair of second amplifiers to any one of the pair of first amplifiers, and the fourth selection circuit configured output an output signal of an other one of the pair of second amplifiers to an other one of the pair of first amplifiers.

3. The driving circuit of claim 2, wherein at least one of the first selection circuit, the second selection circuit, the third selection circuit and the fourth selection circuit includes a multiplexer configured to selectively output input signals.

4. The driving circuit of claim 1, wherein an operation voltage range of any one of the pair of second amplifiers includes an upper area of the operation voltage range of the driving circuit, an operation voltage range of the other one of the pair of second amplifiers includes a lower area of the operation voltage range of the driving circuit, and an operation voltage range of any one of the pair of second amplifiers and the operation range of the other one of the pair of second amplifiers overlap each other in an intermediate area of the operation voltage range of the driving circuit.

5. The driving circuit of claim 1, wherein an offset voltage of the driving circuit is based on an offset voltage of a first of the pair of second amplifiers and on an offset voltage of a second of the pair of second amplifiers.

6. A display device comprising:
a display panel including a plurality of pixels;
a gate driver configured to control the operation of the plurality of pixels; and
a source driver including the driving circuit according to claim 1 and configured to output image signals to the plurality of pixels.

7. A driving circuit comprising:
a first rail to rail amplifier including a first input amplifier and a first output amplifier;
a second rail to rail amplifier including a second input amplifier and a second output amplifier;
a first selection circuit configured to control paths of a first input signal and a second input signal input to the first input amplifier and the second input amplifier;
a second selection circuit configured to control paths of output signals of the first input amplifier and the second input amplifier; and a third selection circuit configured to control paths of output signals of the first output amplifier and the second output amplifier to be output to a first output terminal and a second output terminal,
wherein an output signal output to the first output terminal is a signal amplified by the first input amplifier, and an output signal output to the second output terminal is a signal amplified by the second input amplifier, and
wherein an operation voltage range of each of the first and second input amplifiers corresponds to an operation voltage range of the driving circuit, and an operation voltage range of each of the first and second output amplifiers is smaller than of the operation voltage range of the driving circuit.

8. The driving circuit of claim 7, further comprising:
a fourth selection circuit configured to receive the output signals of the first and second output amplifiers, the fourth selection circuit configured to output at least one of the output signals of the first and second output amplifiers to the first input amplifier, and the fourth selection circuit configured to output an other one of the output signals of the first and second output amplifiers to the second input amplifier.

9. The driving circuit of claim 7, wherein
the operation voltage range of the first output amplifier includes an upper area of the operation voltage range of the driving circuit,
the operation voltage range of the second output amplifier includes a lower area of the operation voltage range of the driving circuit, and
the operation voltage range of the first output amplifier and the operation voltage range of the second output amplifier overlap each other in an intermediate area of the operation voltage range of the driving circuit.

10. The driving circuit of claim 7, wherein an offset voltage of the driving circuit is based on an offset voltage of the first output amplifier and on an offset voltage of the second output amplifier.

11. A display device comprising:
a display panel including a plurality of pixels;
a gate driver configured to control the operation of the plurality of pixels; and
a source driver including the driving circuit according to claim 7 and configured to output image signals to the plurality of pixels.

12. A driving circuit comprising:
a pair of first amplifiers configured to selectively amplify a first input signal and a second input signal;
a pair of second amplifiers, each of the pair of second amplifiers including an operation voltage range included in an operation voltage range of the pair of first amplifiers, the pair of second amplifiers being configured to selectively amplify an output of the pair of first amplifiers,
wherein the offset voltage of the driving circuit is equal to an offset voltage of a first of the second amplifiers minus an offset voltage of a second of the second amplifiers.

13. The driving circuit of claim 12, wherein a signal path through the driving circuit is selected based on at least two driving phases, the signal path being from at least one of the first input signal and the second input signal, the path including one of the pair of first amplifiers and one of the pair of second amplifiers.

14. The driving circuit of claim 13, wherein the first input signal and the second input signal are image signals of a display device, the image signals having opposite polarity, and a first phase of the at least two driving phases is selected to have the image signal having a positive polarity and a second phase of the at least two driving phases is selected to have the image signal having a negative polarity.

15. The driving circuit of claim 12, further comprising:
a plurality of selection circuits configured to select one of the first input signal and the second input signal as input to one of the pair of first amplifiers, and configured to select one of the outputs of the pair of first amplifiers as input to one of the pair of second amplifiers.

16. The driving circuit of claim 15, wherein one of the plurality of selection circuits is configured to select one output of the pair of second amplifiers to provide a feedback loop to the pair of first amplifiers, the feedback loop being configured to perform a buffer operation.

* * * * *